US007573715B2

(12) United States Patent
Mojaver et al.

(10) Patent No.: US 7,573,715 B2
(45) Date of Patent: Aug. 11, 2009

(54) HIGH DENSITY STORAGE SYSTEM

(75) Inventors: Michael Mojaver, Poway, CA (US);
Quan Dong, San Gabriel, CA (US); Ian Fisk, Batavia, IL (US); Andrew Gray, Los Angeles, CA (US)

(73) Assignee: Tempest Microsystems, Poway, CA (US)

( * ) Notice: Subject to any disclaimer, the term of this patent is extended or adjusted under 35 U.S.C. 154(b) by 0 days.

(21) Appl. No.: 11/757,042

(22) Filed: Jun. 1, 2007

(65) Prior Publication Data

US 2008/0030945 A1 Feb. 7, 2008

Related U.S. Application Data

(63) Continuation-in-part of application No. 10/394,964, filed on Mar. 21, 2003, now abandoned.

(60) Provisional application No. 60/810,379, filed on Jun. 2, 2006, provisional application No. 60/366,202, filed on Mar. 21, 2002.

(51) Int. Cl.
*H05K 7/20* (2006.01)
(52) U.S. Cl. .................. 361/716; 361/689; 361/699; 361/701; 361/711; 361/727
(58) Field of Classification Search .................. None
See application file for complete search history.

(56) References Cited

U.S. PATENT DOCUMENTS 5,057,968 A * 10/1991 Morrison .................. 361/700

(Continued)

OTHER PUBLICATIONS

Rachad Youssef, "Master Thesis: Raid for Mobile Computers," Carnegie Mellon University Information Networking Institute, Aug. 1995, pp. 1-35, Pittsburgh, PA.

(Continued)

*Primary Examiner*—Boris L Chervinsky
(74) *Attorney, Agent, or Firm*—Nutter McClennen & Fish LLP; Reza Mollaaghababa; Joshua T. Matt

(57) ABSTRACT

The present invention provides methods and systems for storage of data. In one aspect, the invention provides a data storage system that includes a plurality of storage devices, such as, disks, for storing data, and a controller that implements a policy for managing distribution of power to the storage devices, which are normally in a power-off mode. In particular, the controller can effect transition of a storage device from a power-off mode to a power-on mode upon receipt of a request for reading data from or writing data to that storage device. The controller further effects transition of a storage device from a power-on mode to a power-off mode if no read/write request is pending for that storage device and a selected time period, e.g., a few minutes, has elapsed since the last read/write request for that storage device. In another aspect, the present invention provides a data storage system that includes a plurality of cooling plates, each with one or more storage devices thermally coupled thereto. More specifically, for example, a cooling plate can have a storage device thermally coupled to each of two opposed cooling surfaces. A heat exchanging device can be thermally coupled to the cooling plates, e.g., via fluid channels carrying a cooling fluid, for dissipating heat generated by the storage devices.

36 Claims, 14 Drawing Sheets

U.S. PATENT DOCUMENTS

| | | | |
|---|---|---|---|
| 5,345,347 | A | 9/1994 | Hopkins et al. |
| 5,381,315 | A * | 1/1995 | Hamaguchi et al. .......... 361/727 |
| 5,521,896 | A * | 5/1996 | Bajorek et al. ........... 369/53.18 |
| 5,537,157 | A | 7/1996 | Washino et al. |
| 5,774,292 | A | 6/1998 | Georgiou et al. |
| 5,872,669 | A | 2/1999 | Morehouse et al. |
| 5,898,828 | A | 4/1999 | Pignolet et al. |
| 6,072,697 | A * | 6/2000 | Garcia-Ortiz ............... 361/704 |
| 6,084,771 | A * | 7/2000 | Ranchy et al. .............. 361/699 |
| 6,112,276 | A | 8/2000 | Hunt et al. |
| 6,151,215 | A * | 11/2000 | Hoffman .................... 361/704 |
| 6,280,808 | B1 | 8/2001 | Fields et al. |
| 6,333,849 | B1 * | 12/2001 | Donahoe et al. ............ 361/687 |
| 6,393,853 | B1 * | 5/2002 | Vukovic et al. ............ 62/259.2 |
| 6,477,619 | B1 | 11/2002 | Fujimoto et al. |
| 6,498,723 | B1 | 12/2002 | Konshak et al. |
| 6,512,652 | B1 | 1/2003 | Nelson et al. |
| 6,560,107 | B1 * | 5/2003 | Beck et al. ................... 361/699 |
| 6,725,385 | B1 | 4/2004 | Chu et al. |
| 6,937,540 | B1 | 8/2005 | Kikuchi et al. |
| 6,947,363 | B2 | 9/2005 | Kraemer et al. |
| 7,231,960 | B2 * | 6/2007 | Sakai .......................... 165/76 |
| 2002/0026595 | A1 | 2/2002 | Saitou et al. |
| 2004/0068672 | A1 | 4/2004 | Fisk et al. |
| 2006/0171117 | A1 * | 8/2006 | Hamman .................... 361/699 |
| 2008/0158818 | A1 * | 7/2008 | Clidaras et al. ............. 361/699 |

OTHER PUBLICATIONS

"Random Access Disk Array with Cached Drive Unit," IBM Technical Disclosure Bulletin, IBM Corp., Jun. 1995, New York, U.S.

"The RaidBook: A Source Book For Raid Technology, Passage" Jun. 6, 1993.

* cited by examiner

HIGH DENSITY STORAGE SYSTEM

RELATED APPLICATIONS

The present application claims priority to a provisional application entitled "High Density Data Storage System" filed on Jun. 2, 2006 and having application Ser. No. 60/810,379. The present application is also a continuation-in-part of a utility patent application entitled "Lower Power Disk Array As A Replacement For Robotic Tape Storage" filed on Mar. 21, 2003, and having application Ser. No. 10/394,964 (now published as US 2004/0068672), which in turn claims priority to a provisional application entitled "A Lower Power Disk Array As A Replacement For Robotic Tape Storage" filed on Mar. 21, 2002 and having application Ser. No. 60/366,202. All of these applications are hereby incorporated by reference in their entirety.

BACKGROUND

The present invention relates to methods and systems for storing data, and more particularly, to cost-effective methods and systems for storage and retrieval of a large amount of data, e.g., in a range of tens to hundreds of Terabytes.

The volume of data generated by business processes in a variety of organizations is increasing exponentially with time. Most industrial and business processes are far more efficient in generating digital data than in utilizing it. As a result, the demand for long-term data storage and back-up is growing rapidly. Currently, large scale data warehousing is typically implemented by employing tape media, which suffer from long access latency, namely, the time required for loading the tape and other associated access times. In addition, robotic tape systems are bulky and expensive to maintain.

Since the latency period for access to database items located in a tape archive is typically on the scale of tens to hundreds of seconds, a system overload frequently arises when a database search requires access to data located on many or all of the tapes in a library. Improving robotic tape storage access presents a challenging problem. Even with multiple arms and tape drives, access within each tape remains serial with few opportunities for speeding up access to data. Software approaches that streamline tape access by clustering and de-clustering multiple accesses are known. These approaches can improve performance of Petabyte tape libraries that include several hundred Terabytes of disk cache. These approaches, however, can not eliminate the fundamental limitations arising from tape access latency.

Magnetic disk storage currently available presents an alternative to tape. Current commodity disk drive units are only marginally more costly than tape media and will be less costly within a few years, if current trends continue.

However, disk-based systems having very large storage capacities, for example, hundreds of Terabytes, are very costly, and offer short retention life in comparison to tape. Redundant Arrays of Inexpensive Disks (RAID) include a small number of disk drives, and an interface that presents these drives as a single large disk to a user while protecting data loss in case of failure of any of the disks. Current RAID systems have a maximum storage capacity of approximately a Terabyte, and are optimized for random access speed.

A storage area network (SAN) provides a practical approach for combining many RAID modules to obtain high storage capacity, for example, tens of Terabytes, albeit at high cost. Networked Attached Storage (NAS) devices provide another alternative for high capacity disk storage. A NAS cluster relies on the scalability of networks in a file server topology to provide high storage capacity. However, similar to SAN, NAS devices can also be costly.

Temperature management can be important in high density data storage systems. For example, poor thermal characteristics in a disk array system can reduce its reliability and lifetime. Operating a drive above its nominal temperature (e.g., over the life of a drive) can result in a higher failure rate. Further, excessive temperature can create or exacerbate problems with many components in a disk drive, from the actuation arm and spindle motor to the bearings.

Accordingly, there is a need for cost effective methods and systems for high speed, and high capacity storage of data. There is also a need for enhanced thermal management of high capacity data storage systems.

SUMMARY OF THE INVENTION

The present invention provides in one aspect a data storage system that includes a plurality of storage devices, for example, tens or hundreds of storage devices such as disks, for storing data, and a controller that is coupled to these storage devices via a bus or any other suitable device. The storage devices, which preferably provide permanent data storage, are normally in a power-off mode. That is, in the absence of processing an input/output (I/O) request, each storage device is decoupled from a power source that would otherwise supply power (e.g., electrical power) to that storage device.

The controller, which can be programmed in software or in hardware, effects transition of a storage device from a power-off mode to a power-on mode upon receipt of a request for access to that storage device, for example, for reading data from or writing data to that storage device, i.e., a read/write request. When storage devices are disks, this approach effectively treats the disks as inexpensive tape drives.

The controller can be implemented as a central device to manage power distribution to all storage devices in a manner described above. Alternatively, a plurality of controllers, each managing power distribution to each individual storage device or a group of storage devices, can be employed. Hence, the term "controller," as used herein, is intended to refer to a single central control device or a plurality of devices that collectively implement a policy for distributing power to a plurality of storage devices according to the teachings of the invention.

In a related aspect, the controller further effects transition of a storage device from a power-on mode to a power-off mode if no access request, e.g., no read/write request, is pending for that storage device and a selected time period, e.g., a few seconds, a few minutes, or a few hours, has elapsed since the last read/write request for that storage device.

A variety of storage devices can be utilized in a system according to the invention. Such storage devices include, but are not limited to, magneto disks and optical media. Each storage device can have a data storage density in a range of about 100 Megabytes per cubic centimeter to about 1 Gigabytes per cubic centimeter, and more preferably in a range of about 100 Megabytes per cubic centimeter to about 10 Gigabytes per cubic centimeter. A group, or the entire, of storage devices can be housed in an enclosure (chassis), and a plurality of chassis can be disposed on a rack. The storage devices in a system of the invention can provide, for example, a collective storage in a range of about 25 TB to about 50 TB per chassis and in a range of about 250 TB to about 500 TB per rack. Further, the storage devices can form a RAID storage system. It should be understood that as the storage capacity of storage media suitable for use in a system of the invention increase, the collective storage capacity, or in other words, data storage density, provided by a system of the invention can also increase.

In another aspect, a storage system of the invention as described above, can include a relay coupled to the controller that receives signals from the controller, and electrically connects or disconnects one or more selected ones of the storage devices to a source of power.

In further aspects, a data storage system according to the invention can include a cache storage, having, for example, a cache memory and a cache disk, coupled to the controller for storing selected data retrieved from one or more of the storage devices. This is particularly useful for rapid access to data that is likely to be requested in the future by one or more processes. For example, in some embodiments, when an executing process requests data corresponding to a portion of a file residing on one of the storage devices, the controller would retrieve the entire file, transmit the requested portion to the executing process, and store the entire file on the cache storage. In the likely event that the executing process requests access to another portion of the file, the requested portion can be rapidly retrieved from the cache storage.

In another aspect, the present invention provides a method for managing power distribution to a plurality of storage devices that calls for effecting transition of each storage device from a power-off mode to a power-on mode upon receipt of a request for writing data to or reading data from that storage device. The method further calls for effecting transition of a storage device from a power-on mode to a power-off mode if no read/write request is pending for that storage device, and a selected time period has elapsed since the receipt of the last read/write request.

In further aspects, the invention provides an improved data storage system having a plurality of storage devices disposed in an enclosure, herein also referred to as a chassis, so as to provide a data storage density in a range of about 50 Megabytes per cubic centimeter to about 0.5 Gigabytes per cubic centimeter, or preferably a data storage density in a range of about 100 Megabytes per cubic centimeter to about 1 Gigabyte per cubic centimeter, or more preferably in a range of about 100 Megabytes per cubic centimeter to about 10 Gigabytes per cubic centimeter. One or more controllers coupled to the storage devices implement a power distribution policy as described above for supplying electrical power to the storage devices. More particularly, the controllers can effect transition of one or more storage devices from a power-off mode to a power-on mode upon receipt of a request for accessing those storage devices, and can further effect transition of one or more storage devices from a power-on mode to a power-off mode if no access requests are pending for those storage devices and a selected time period has elapsed since the last access request for those storage devices.

In another aspect, the present invention provides a data storage system that includes a plurality of storage devices, such as magnetic or optical disks, mounted in an enclosure so as to have a collective density greater than about 100 Megabytes per cubic centimeter, e.g., in a range of 100 Mbytes per cubic centimeter to about 10 Gigabytes per cubic centimeter, or in other embodiments, in a range of about 10 Gigabytes per cubic centimeter to 20 Gigabytes per cubic centimeter. A plurality of cooling plates having opposed cooling surfaces can be mounted in the housing and thermally coupled to at least one of the storage devices. In some embodiments, each cooling plate can have two storage devices thermally coupled to it, one to each of its opposed cooling surfaces.

The data storage system can also include a heat exchanging device, such as a radiator or refrigeration unit, that is thermally coupled to the cooling plates for dissipating heat generated by the storage devices. For example, fluid channels carrying a cooling fluid can be formed in the cooling plates, e.g., having an inlet port through which cooling fluid enters and a outlet port through which cooling fluid exits, and the fluid channels can be connected via tubes to the heat exchanging device. The heat exchanging device can cause the fluid to flow through the fluid channels at a rate of about 75 Lph (Liters per hour) to 190 Lph. A flow control element can be provided and associated with one or more cooling plates to control the flow of cooling fluid, e.g., starting or stopping the flow to a cooling plate for which it controls the flow. In some embodiments, the heat exchanging device can maintain an average temperature among the plurality of storage devices below a threshold, e.g., 35 degrees Celsius, and/or maintain a peak temperature among the plurality of storage devices below a threshold, e.g., 45 degrees Celsius.

In many embodiments, the data storage system can be adapted such that the storage devices can be readily inserted into and removed from the enclosure. For example, one or more of the storage devices can be removably attached to a mounting element (e.g., via engaging tabs) that is adapted to slide along a cooling plate. An I/O connector, such as an electrical connector, can be provided in the enclosure so as to mate with a complementary I/O connector on a storage device when the storage device is inserted, e.g., by sliding it, into the enclosure.

In yet other embodiments, the data storage system can include a controller that is coupled (e.g., electrically coupled) to the storage devices to maintain the storage devices normally in a power-off mode and effect transition of one or more of the storage devices from a power-off mode to the power-on mode upon receipt of a read-write request for those storage devices. The controller can effect transition of a storage device from a power-on mode to a power-off mode if no read/write request is pending for that storage device and a selected time period has elapsed since the last read/write request for that storage device.

In other aspects, the present invention provides a cooling system for a data storage system. An exemplary cooling system can have an array of cooling plates mounted in an enclosure, where each cooling plate is thermally coupled to a heat exchanging device. The cooling system can also include a plurality of mounting elements that are configured to attach to a data storage device (e.g., a magnetic or optical storage device). Such a mounting element can be slidably coupled to one of the cooling plates so as to be movable between an inserted position in which it is disposed adjacent to a cooling plate and an extended position in which it extends out of the enclosure. In some embodiments, one or more cooling plates can have opposed cooling surfaces, and one mounting element can be slidably coupled to a first opposed cooling surface while a second mounting element is slidably coupled to a second opposed cooling surface. The cooling system can also have any of the characteristics previously described, including thermal coupling of the heat exchanging device to the cooling plates, fluid channels in the cooling plates, operating characteristics of the heat exchanging device, and/or adaptations for inserting and removing storage devices from the enclosure. In many embodiments, the cooling system can include a plurality of storage devices that can be thermally coupled, e.g., two to a cooling plate, so as to provide a storage density greater than about 100 Megabytes per cubic centimeter.

In another aspect, the invention provides methods for regulating temperature in a data storage system. An exemplary method can include arranging a plurality of cooling plates in an enclosure and thermally coupling the cooling plates to a heat exchanging device. The method can further include inserting a storage device into an array of storage devices disposed in an enclosure, the array having a data storage density of greater than about 100 Megabytes per cubic centimeter. The storage device can be inserted adjacent to one of the cooling plates such that it is in thermal communication with it. In some embodiments, a second storage device can be inserted adjacent to the same cooling plate such that it is thermal communication with it as well. In some embodiments, the cooling plate can have two opposed cooling surfaces, and the first storage device can be inserted so as to be thermally coupled to a first cooling surface of the cooling plate while the second storage device can be inserted so as to thermally couple to a second cooling surface of the cooling plate. The method can also include electrically coupling a storage device to a data communication interface within the enclosure.

In some embodiments, an exemplary method can also include operating the heat exchanging device so as to maintain an average temperature of the array of storage devices below a threshold, e.g., 35 degrees Celsius, or to maintain a peak temperature of the array of storage devices below a threshold, e.g., 45 degrees Celsius. In addition, a cooling fluid can be moved through the cooling plates and through the heat exchanging device to dissipate heat. The flow rate of the cooling fluid can be in the range of about 75 Lph to 190 Lph.

Further understanding of the invention can be obtained by reference to the following detailed description in conjunction with associated drawing, which are described briefly below.

DETAILED DESCRIPTION

The present invention provides systems and methods for cost-effective storage and retrieval of a large amount of data while minimizing physical space required for such storage. As discussed in more detail below, a system of the invention can include a plurality of selected storage media, e.g., disks, which can be, for example, packed in an enclosure in close proximity of one another. Each storage medium is normally in a power-off state in order to alleviate the thermal load of the system. A controller is utilized to transition a selected one of the storage media from a power-off mode into a power-on mode in order to read data from and/or write data to that storage medium.

Figure 1:
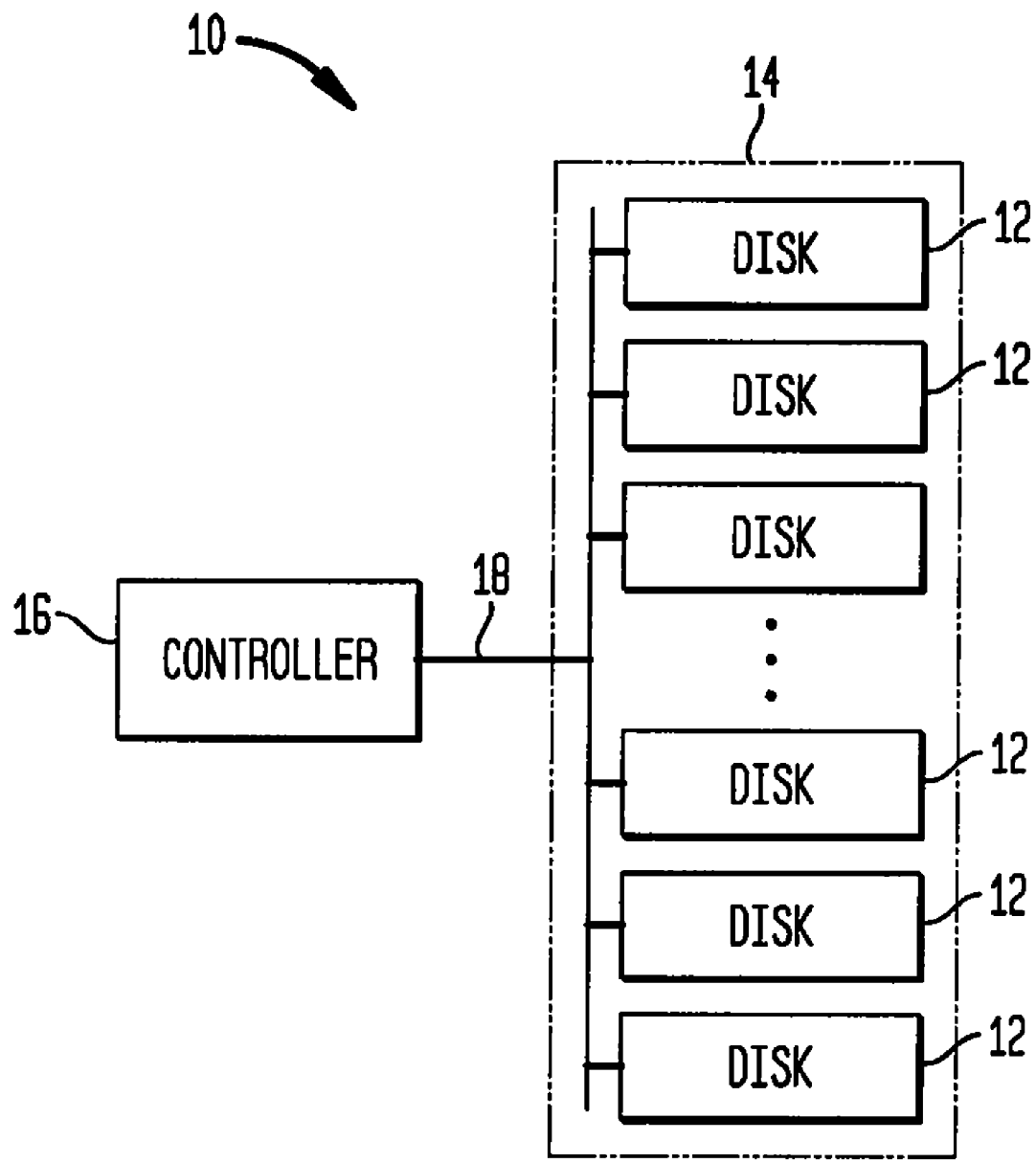
FIG. 1 schematically illustrates an exemplary data storage system according to the teachings of the invention.

With reference to FIG. 1, an exemplary data storage system 10 according to the teachings of the invention includes a plurality of storage devices 12, for example, disks, provided in an enclosure 14, and a controller 16 that can communicate with the storage devices 12 via, for example, a bus 18. The controller 16 can be housed within the enclosure 14, or alternatively, it can be provided external to the enclosure. The controller 16 can effect the transition of each storage device 12 from a power-off mode, i.e., a mode in which the storage device is disconnected from power, to a power-on mode, i.e., a mode in which power is delivered to the storage device, upon receipt of a read/write request for that storage device. That is, an idle storage device, i.e., a storage device for which no read or write request has been received for a selected period of time and for which no request is pending, is maintained in a power-off mode, and is only powered up when a read/write request is received.

The controller 16 can further effect the transition of a storage device 12 from a power-on mode to a power-off mode if no read/write request is received and/or pending for that storage device and a selected time period, for example, a time period in a selected range, e.g., in a range of a few seconds to a few hours, has elapsed since the last read/write request for that storage device.

Figure 2:
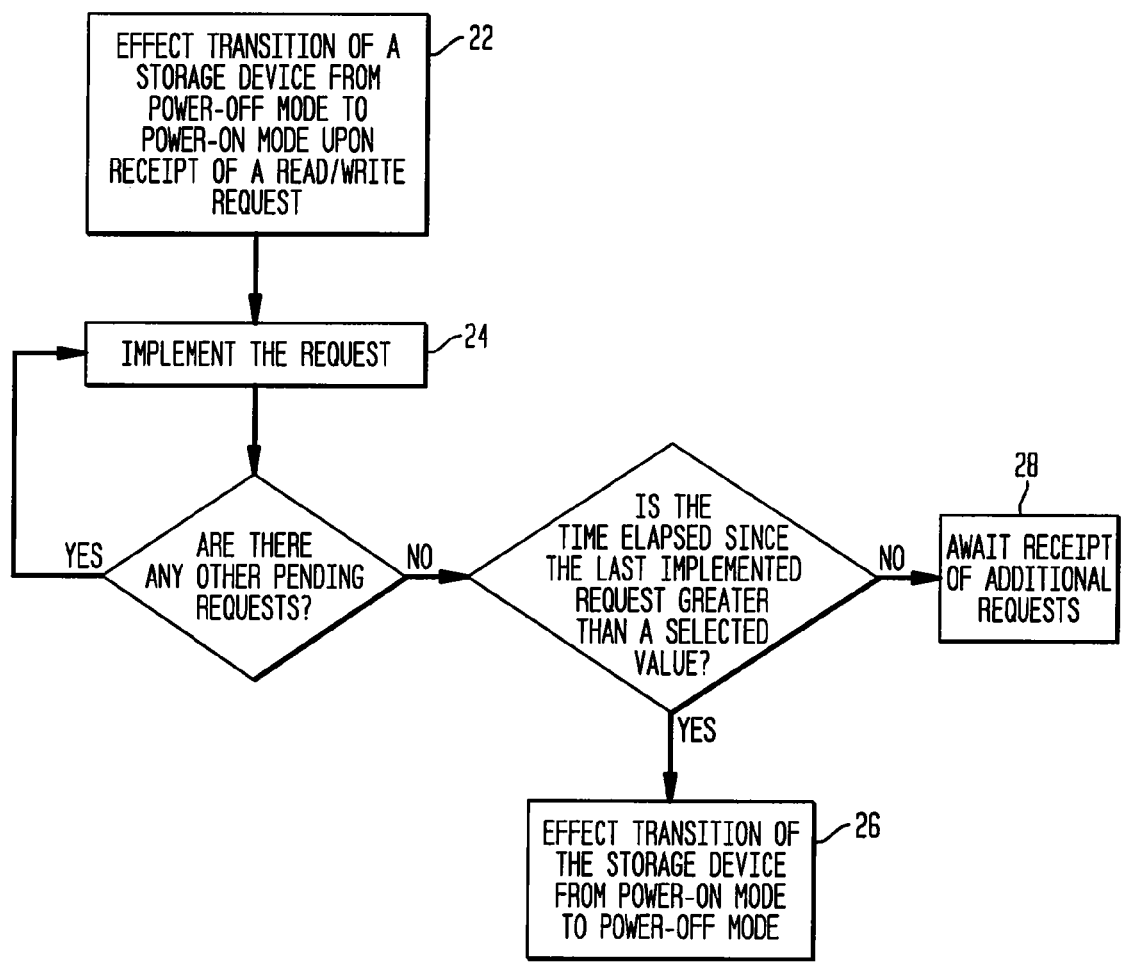
FIG. 2 is a block diagram depicting various steps in a method according to the teachings of the invention for managing power distribution to a plurality of storage devices.

A method according to the teachings of the invention for managing power distribution to a plurality of storage devices, implemented by the exemplary data storage system 10, can be perhaps better understood by reference to a flow chart 20, shown in FIG. 2, that describes various steps of such a method. In particular, in step 22, an idle storage device for which a read/write request is received is effected to transition from a power-off mode to a power-on mode, and, in step 24, the read/write request is implemented. Further, any other pending request associated with that storage device is also implemented.

With continuing reference to the flow chart 20, in the absence of any pending requests, and if the time elapsed since the receipt of the last implemented request exceeds a selected value, in step 26, the power to the storage device is disconnected, i.e., the storage device is effected to transition from a power-on mode to a power-off mode. Otherwise, the system awaits receipt of additional read/write requests, if any (step 26).

A data storage system according to the teachings of the invention provides a number of advantages over conventional systems. For example, conventional RAID devices typically utilize about 10 drives per enclosure to meet the power and thermal limitations of fast disk drives. In contrast, a data storage system of the invention allows an order of magnitude more drives to be supported in the same enclosure by substantially reducing power dissipation of the drives. That is, a data storage system of the invention utilizes a policy for managing distribution of power to a plurality of storage devices, as described above, that reduces the overall power consumption of the system. This allows a more compact configuration for the storage system, and also allows more disk drives to share the same electronics control system, thereby lowering the cost of manufacturing.

Further, an initial access latency to a storage device that is in a power-off mode in a data storage system of the invention can be approximately 10 seconds. This access latency is comparable to the best case, i.e., tape drive is empty and data is located at the beginning of the tape, access time for robotic tape libraries. Any additional access for performing read/write operations in data storage system of the invention will be at full random access speed.

Moreover, as discussed above, in a system of the invention, the storage devices, e.g., disks, are normally in a power-off state. This advantageously reduces wear and tear experienced by each storage device if it is accessed infrequently, thereby lengthening its shelf life. For example, magnetic disks cease to spin when transitioned into a power-off state, and hence experience less wear and tear in this state.

In some embodiments of the invention, techniques can be utilized to maintain the most frequently accessed drives highly available, for example, by lengthening the inactive period after which the device is transitioned to a power-off mode.

A direct disk peripheral interface can enhance database performance by eliminating the software overhead associated with distributed networked storage. The expected data storage I/O rate can be supported using a high speed interface.

Figure 3:
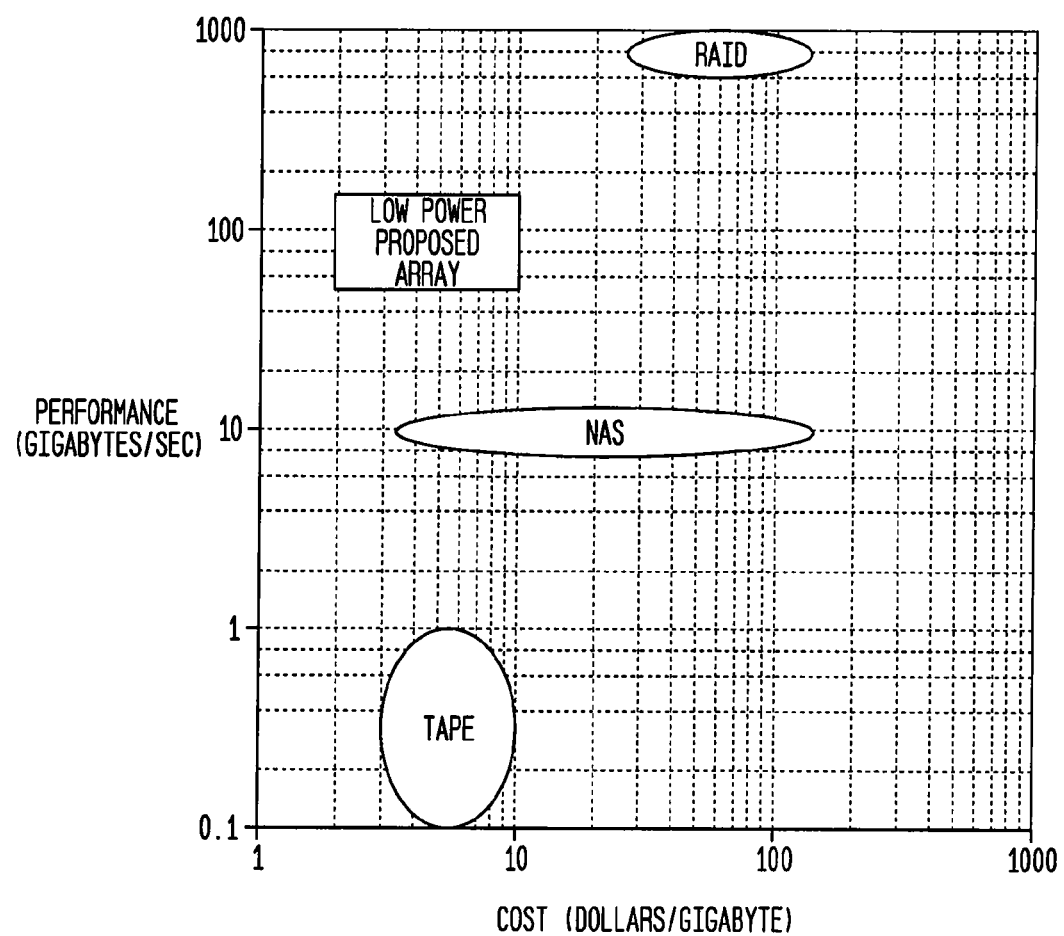
FIG. 3 is a diagram illustrating cost/performance characteristic of an exemplary data storage system of the invention relative to a number of conventional systems.

FIG. 3 schematically depicts the cost/performance characteristics of an exemplary data storage system of the invention having an array of disks relative to those of a number of conventional storage systems. The graph of FIG. 3 plots performance versus cost (in a log-log scale). As shown in this figure, a data storage system of the invention can provide considerably enhanced performance relative to tape libraries or NAS devices at comparable or reduced cost. Further, a data storage system of invention can be less costly than a conventional RAID system.

Figure 4:
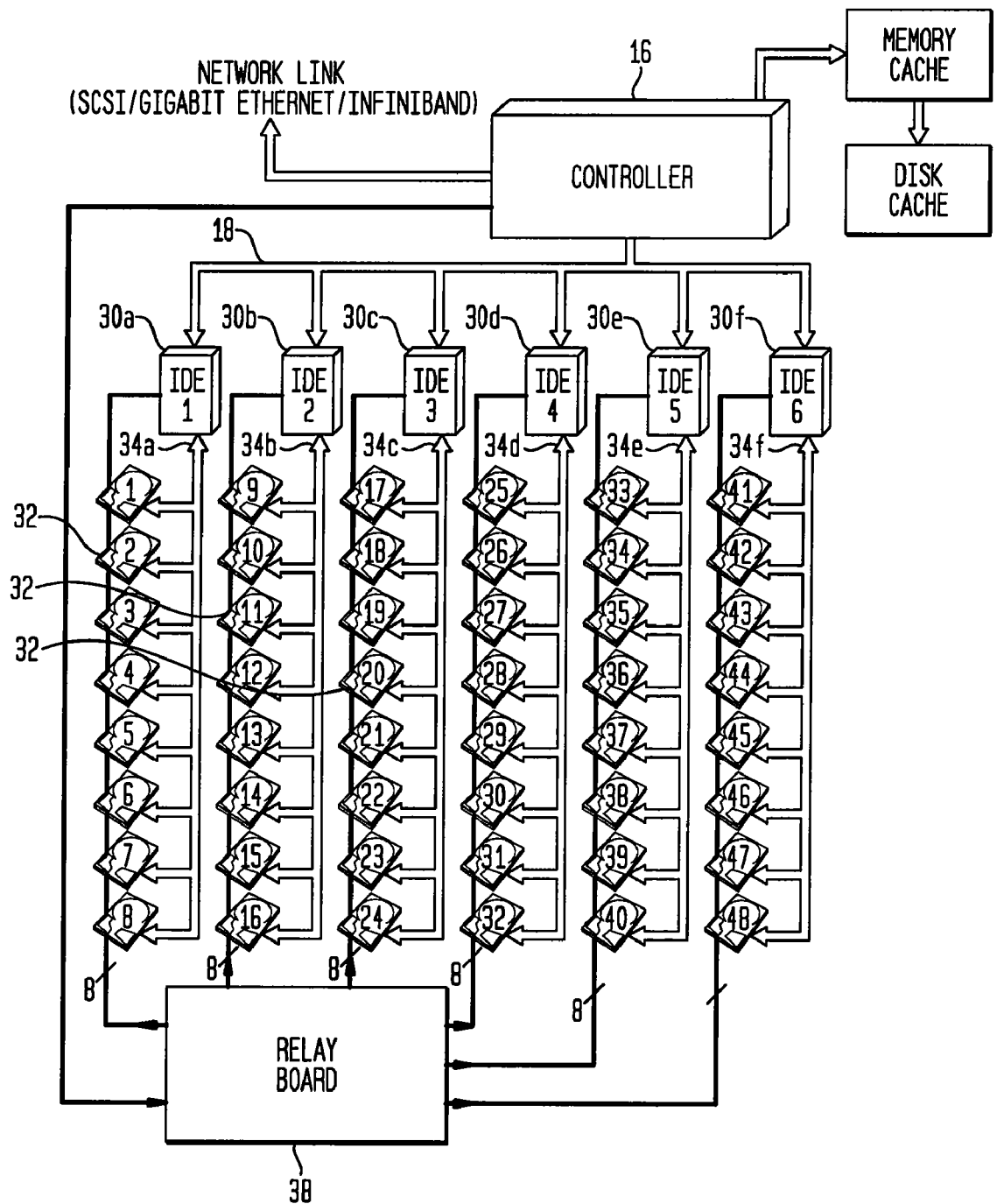
FIG. 4 is a diagram schematically depicting an exemplary prototype data storage system built according to the teachings of the invention, FIG. 5 schematically depicts the storage devices of FIG. 4 housed in an enclosure.

In order to demonstrate the feasibility of manufacturing a storage system according to the teachings of the invention, and the efficacy of such a system for storage and retrieval of a large amount of data, a prototype system was built and tested. FIG. 4 schematically illustrates that this prototype system includes a controller 16 that can communicate, via a bus 18, with a plurality of hard disk drive interfaces 30a-30f, herein collectively referred to as drives 30, operating based on Integrated Drive Electronics (IDE) interface standard. The drives 30 communicate and control a plurality of hard disks 32 via buses 34a-34f. More particularly, in this exemplary prototype, each hard disk drive 30 controls access to eight hard disks, each of which has a storage capacity of about 200 Gigabytes.

Figure 5:
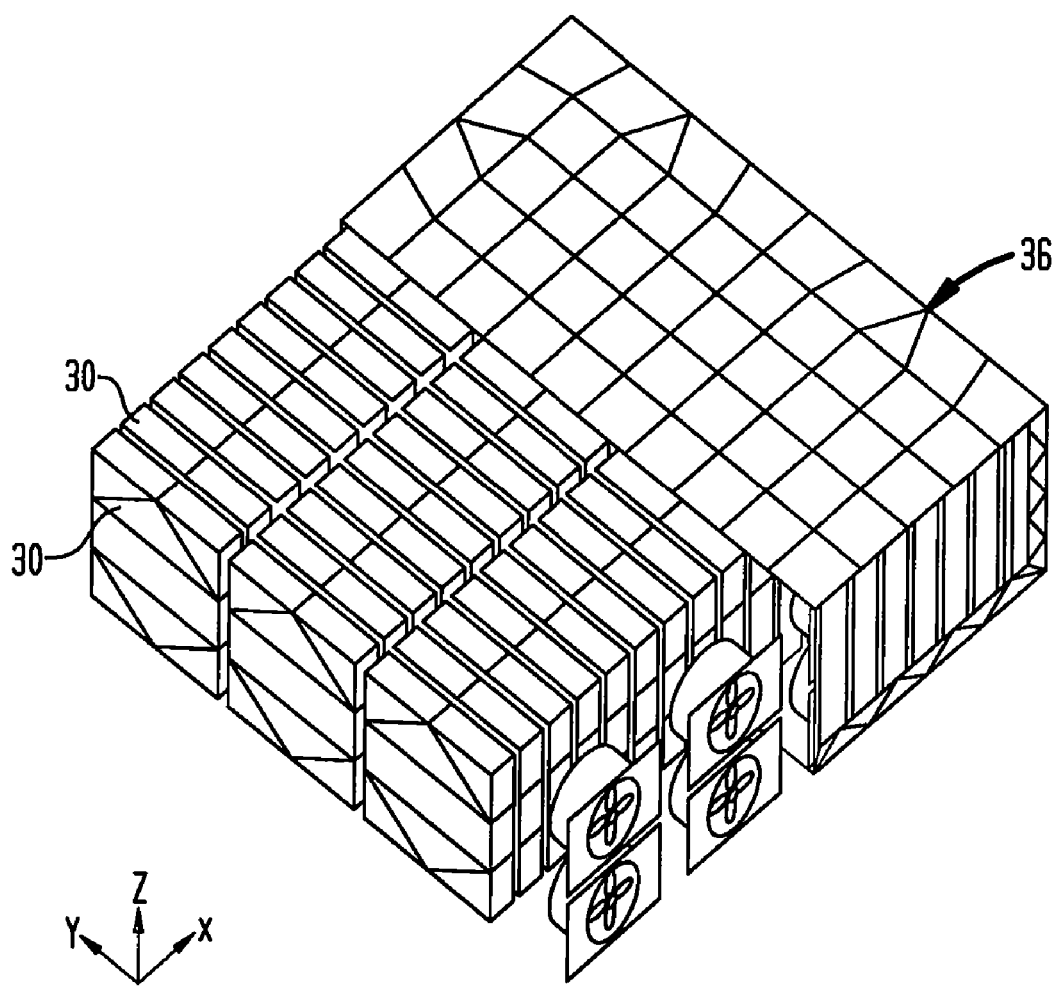

The hard disks 30 are housed in an enclosure 36, schematically depicted in FIG. 5, having approximate dimensions of 24 inches by 19 inches by 6 inches (approximately 60 cm.times.50 cm.times.15 cm). Although only 48 drives are utilized in this exemplary prototype, it should be understood that a system of the invention can be constructed with hundreds of disks to provide a collective storage capacity in a range of about 25 Terabytes to about 50 Terabytes per chassis and a storage capacity in a range of about 250 to about 500 Terabytes per rack.

Referring again to FIG. 4, the hard disks 32 are normally in a power-off mode. The controller 16 can cause the transition of one or more of the hard disks from a power-off mode to a power-on mode upon receipt of a request for accessing those hard disks. More particularly, the controller 16 can send signals to a relay board 38 for supplying power to one or more selected ones of the disks 32. Alternatively, the controller 16 can send signals to the relay board 38 for disconnecting one or more selected ones of the disks 32 from a source of power (not shown in this figure). For example, if a disk that is in a power-on mode is not accessed for a selected time period, e.g. a time period in a range of a few seconds to about a few minutes (e.g., 15 minutes), the controller can instruct the relay board to shut off power to that disk.

In this exemplary prototype, the controller 16 implements a plurality of requests for accessing the hard disks on a FIFO (first-in-first-out) basis. Those having ordinary skill in the art will appreciate that any other suitable algorithm for processing the requests can also be utilized. While the available power is typically the primary factor that determines the maximum number of disks that can be simultaneously switched on, it is an acceptable level of thermal load that typically provides an upper limit for the maximum number of disks that can be simultaneously in a power-on state. This upper limit imposed by the thermal load depends in general not only on the number of disks that are in a power-on state but also on their distribution within the enclosure. For example, more disks can be in a power-on state if they are sparsely distributed. In this exemplary prototype, it is feasible to have about 25 percent of the disks in a power-on state without encountering any thermal overload. It should, however, be understood that this exemplary prototype is provided only as an example, and the 25 percent limit is not intended to indicate an absolute upper limit in other embodiments of the invention. In particular, various improvements, including providing better thermal insulation and/or cooling mechanisms (e.g., as discussed below), can be employed to increase the maximum number of disks that can be simultaneously in a power-on state.

When the controller 16 receives a request for access to a disk that is in a power-off state while the number of other disks that are in the power-on state has reached an upper threshold imposed by the thermal load, the controller 16 can suspend access to one of the disks that is already in a power-on state, and transition that disk to a power-off state, in order to allow switching on the requested disk that is in a power-off state. The selection of a disk to be transitioned into a power-off state to allow transitioning a new disk from a power-off state to a power-on state can be performed based on a FIFO protocol, although other protocols can also be employed. In a FIFO protocol, a disk that has been in a power-on state for the longest time period is the first to be selected for being transitioned into a power-off state. If the selected disk is presently processing an input-output (I/O) request, the I/O processing can be blocked before transitioning the disk into a power-off state. The blocked I/O processing can, however, be scheduled to resume once the disk can be switched back on without causing thermal overload, for example, once one or more other disks have been switched off. A scheduler can manage the blocking and resumption of the I/O requests based on a selected scheduling protocol. Such a scheduler can be built, for example, as a kernel process or alternatively as a multi-threaded user program.

With continued reference to FIG. 4, the exemplary controller 16 is also in communication with a memory cache 40, which can in turn communicate with a disk cache 42 for storing selected data retrieved from any of the hard disks 32. The data stored on the memory cache or the disk cache can be subsequently retrieved, if desired, very rapidly. In this exemplary protocol, when the controller receives a request for retrieval of a portion of a file residing on one of the disks, the controller retrieves the entire file, or an entire directory in which the file resides. The requested portion is transmitted to the process requesting it, and the entire file or directory is stored on the cache 42. This allows rapid retrieval of any other portion of the file, or other files in the directory, upon future requests.

In this exemplary prototype, the disks 32 are configured as a RAID system. For example, four disks are transitioned together from a power-off to a power-on mode, or vice versa, so as to allow maintaining data redundancy. It should be clear, however, that in an alternative embodiment, each of the disks can be accessed individually.

Further, the controller 16 can include a network interface for linking the controller to a selected network, for example, a storage area network (SAN).

In other embodiments of the invention, storage systems having cooling systems are provided. In some such embodiments, the cooling system can remove heat from a plurality of storage devices, which can be mounted so as to be in thermal coupling with a plurality of cooling plates in an enclosure. In many implementations, the cooling plates are configured to transfer heat generated by one or more of the storage devices to a heat exchanging device, which in turn dissipates the heat. Furthermore, each cooling plate can include one or more channels that allow the flow of a cooling fluid therethrough in order to facilitate the removal of heat, preferably via thermal conduction, from the storage devices. The cooling system can allow the storage system to be configured with a high storage density.

Figure 6:
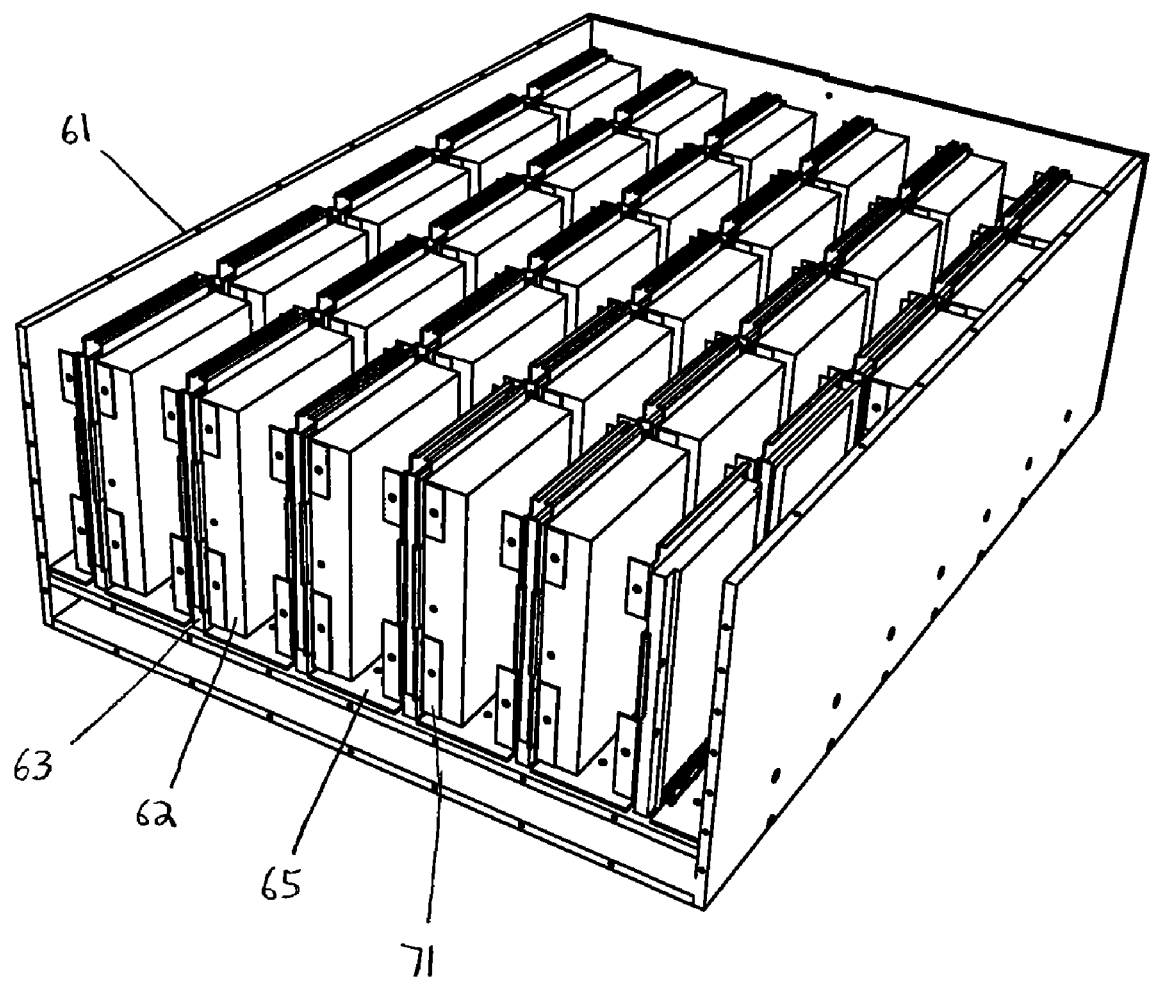
FIG. 6 illustrates an exemplary data storage system having a cooling system according to one embodiment of the invention.
Figure 7:
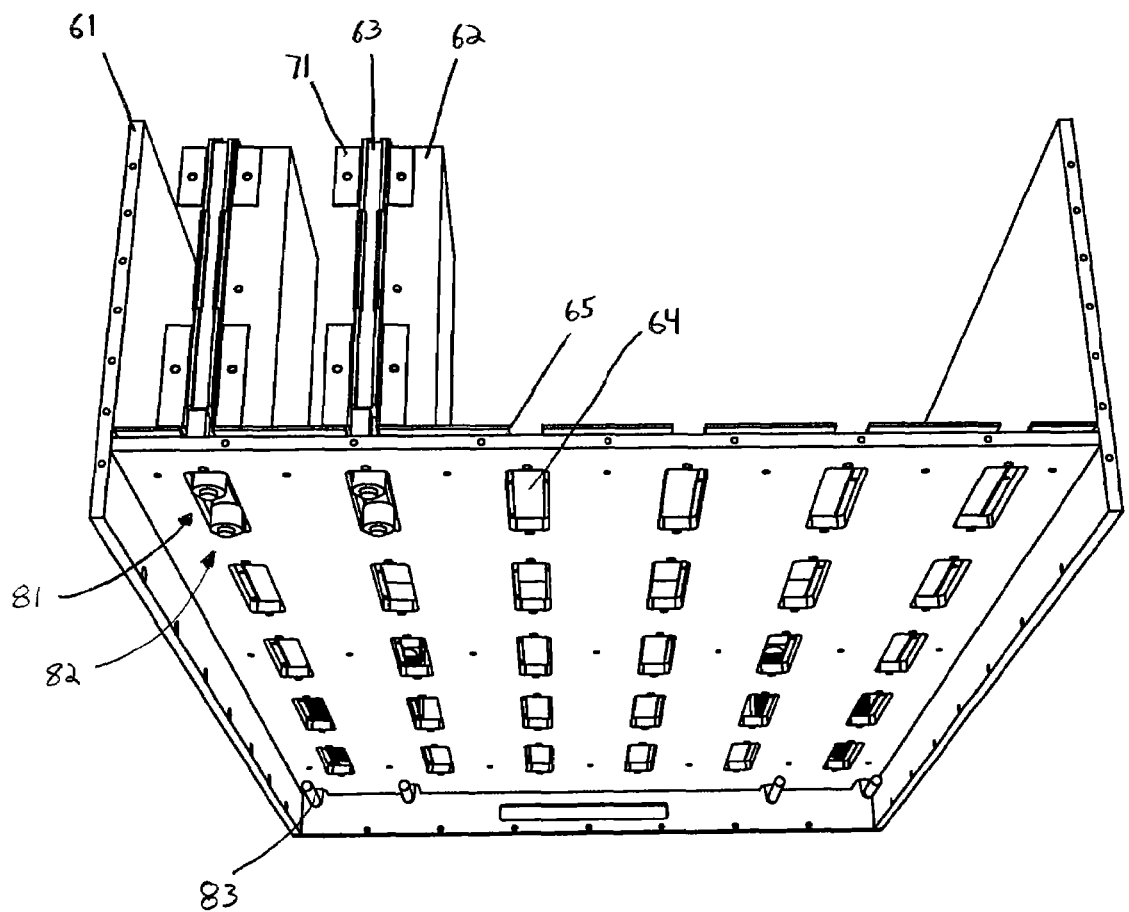
FIG. 7 illustrates another view of the data storage system shown in FIG. 6.
Figure 8:
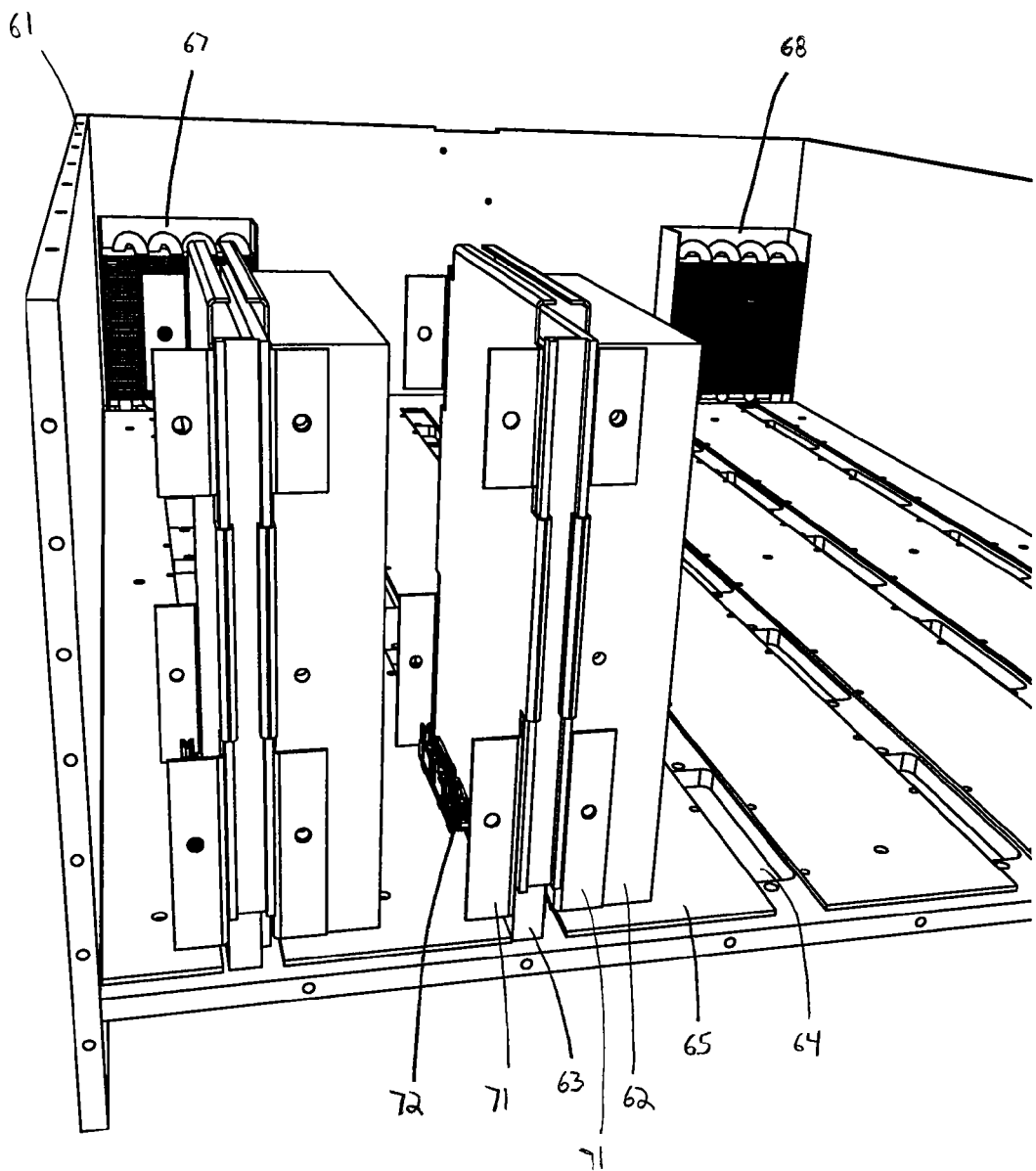
FIG. 8 illustrates the data storage system shown in FIG. 6 in more detail.

By of way example, FIGS. 6-8 depict a data storage system 60 which has a cooling system according to one embodiment of the invention. As shown, the data storage system 60 can include an enclosure 61 in which a plurality of storage devices 62 (for simplicity, all storage devices are referred to herein as storage device(s) 62, although a variety of different storage devices, e.g., magnetic and optical, with different specifications can be used in a system). In many embodiments, the storage devices number between 48 and 128, but virtually any number can be used. The storage devices can be mounted in an enclosure so as to provide a data storage density, defined as the collective storage capacity of the storage devices divided by the volume of the enclosure, in a range of about 100 Mbytes per cubic centimeter to about 10 Gigabytes per cubic centimeter, and preferably in a range of about 0.5 Gigabytes per cubic centimeter to about 10 Gigabytes per cubic centimeter, and more preferably about 20 Gigabytes per cubic centimeter. In some embodiments the data storage system 60 provides an overall storage capacity (e.g., a data storage capacity) in a range of about 1 Terabytes to about 50 Terabytes, and in other embodiments the storage capacity can be about 100 Terabytes to a few hundred Terabytes. In some embodiments, the storage capacity of the system can be achieved using a plurality of storage devices, each with a storage capacity less than the storage capacity of the system, e.g., less than about 1 Terabyte. As shown in FIG. 6, the plurality of storage devices 62 can be thermally coupled to a plurality of cooling plates 63, which can be attached to the enclosure via a plurality of slots 64 (best seen in FIG. 7) provided in a printed circuit board (PCB) 65. (Again, for simplicity, all cooling plates are referred to herein as cooling plate(s) 63, although they need not be the same.) In other embodiments, a cooling plate forming the bottom of the enclosure can be adapted to remove heat from below the storage devices.

The cooling plates 63 can be thermally coupled (e.g., via cooling fluid channels 79, 80 extending into the cooling plates 63 through the slots 64, as shown in FIG. 7 and discussed in more detail below) to heat exchanging devices 67, 68, such as radiators, or refrigeration units. The cooling plates 63 can be mounted in the enclosure 61 such that each cooling plate 63 is in thermal contact with a selected number of storage devices 62 (e.g., two storage devices 62 in this embodiment). More specifically, the storage devices 62 can be in thermal contact with a cooling surface of the cooling plate 63.

Figure 10:
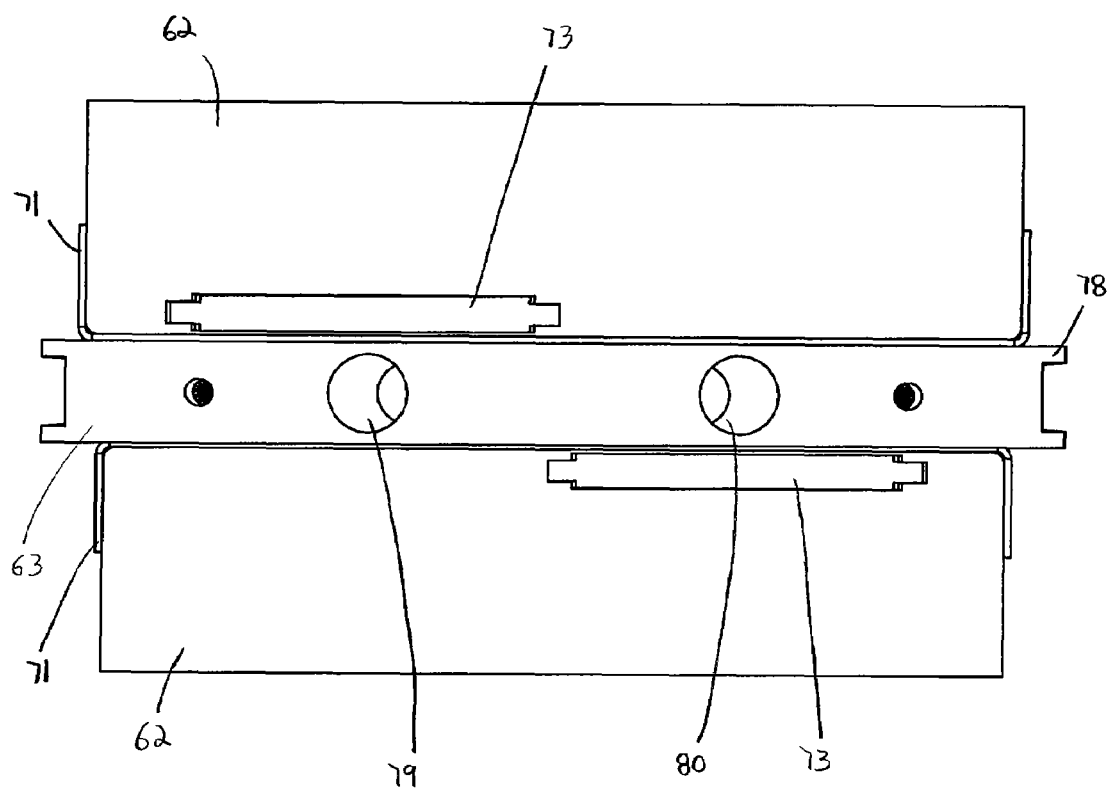
FIG. 10 illustrates a bottom view of the cooling plate shown in FIG. 9 and its associated storage devices.

As shown in FIG. 6, each cooling plate 63 has two opposed cooling surfaces 69, 70. A first storage device can be in thermal contact with a first cooling surface 69 and a second storage device can be in thermal contact with a second opposed cooling surface 70. (For illustrative purposes, FIGS. 6-8 show only one storage device 62 per cooling plate 63, although two storage devices can be used. FIG. 10 shows a cooling plate configuration having two storage devices in more detail.) A mounting element, such as a mounting plate 71, can be removably attached to a storage device 62. The mounting plate 71, along with the storage device 62 to which it is attached, can be slidably coupled to a cooling plate 63 (e.g., by sliding the mounting plate 71 and the storage device 62 vertically down along a cooling surface 69, 70 of the cooling plate 62), which can facilitate the thermal coupling of the storage device 62 to a cooling plate 63 and/or its cooling surfaces 69, 70. Such a configuration can allow the storage device 62 to be easily inserted and removed from the data storage system 60. In some embodiments, the data storage system 60 can be oriented such that the plurality of storage devices 62 can be inserted vertically down into the enclosure 61, such that gravity assists in seating and latching the storage devices 62. Further, an I/O connector 72, such as an electrical connector, can be disposed on the PCB board 65 such that, when the storage device 62 is inserted, it will mate with a complementary I/O connector 73 disposed on a storage device 62, e.g., for data communication. This electrical connector can allow communication with a system controller, e.g., for managing data communication and/or power management for the storage device 62 and/or the array of storage devices, such as the controller discussed above in connection with other embodiments.

Figure 9:
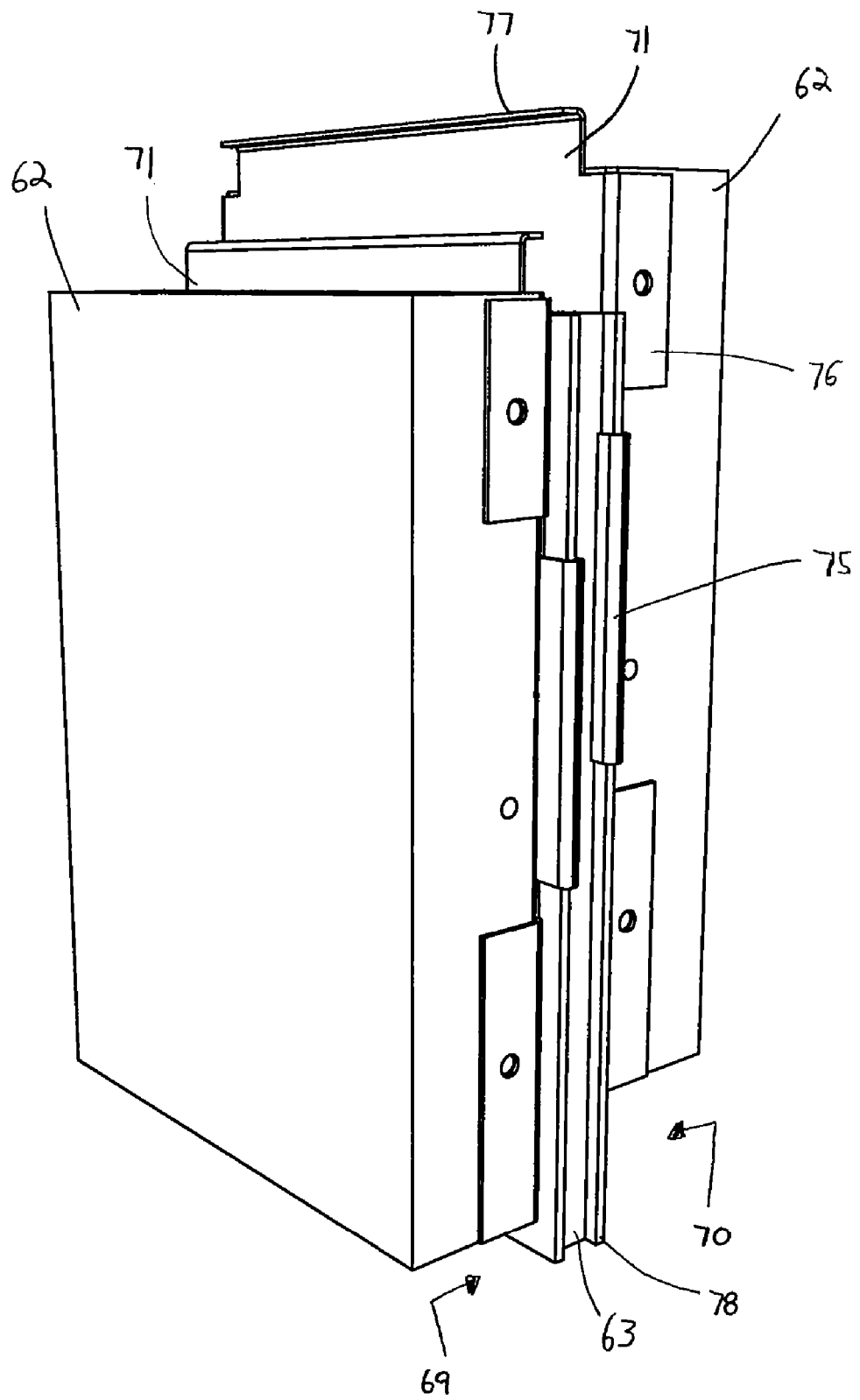
FIG. 9 illustrates an exemplary cooling plate utilized in the data storage system shown in FIG. 6 with two storage devices thermally coupled thereto.

By way of further illustration, FIG. 9 schematically depicts an exemplary cooling plate 63 that is in thermal contact—concurrently—with two storage devices 62. A variety of configurations are possible, but as shown, the exemplary cooling plate 62 is in thermal contact at one surface 69 thereof with a storage device 62 and is in thermal contact at an opposed surface 70 thereof with another storage device 62. In many embodiments, the storage devices 62 are preferably thermally coupled to the cooling plate 63 so as to maximize the surface contact therebetween. In some implementations, a cooling plate can be in thermal contact, e.g., via conduction through physical contact, with at least 80%, and preferably 90%, or more preferably 100% of the area of a surface of at least one the storage devices. The mounting plates 71 can facilitate thermal coupling of the storage devices 62 to the cooling plate 63. In this embodiment, each mounting plate 62 includes a plurality of guiding tabs 75 configured to slidably engage with rails 78 on the sides of the cooling plate 63 to bring the storage device 62 in thermal contact with the cooling plate 63. Each mounting plate 71 can have a plurality of tabs 76 adapted to be removably attached to a storage device 62, e.g., via screws or an interference fit. A tab 77 at the top of the mounting plate 71 can contact the top surface of the cooling plate 63 when the cooling plate 63 is fully inserted into an enclosure 61 so as to ensure that a proper insertion depth is achieved, e.g., to ensure that the storage device 62 is properly positioned relative to the cooling plate 63 and that the I/O connector 73, if any, at the bottom of the storage device 62 (shown in FIG. 10) is properly engaged to the PCB 65. In this manner, the storage devices 62 can be removably and replaceably mounted to the enclosure 61 with each storage device 62 forming a thermal connection with one of the cooling plates 63 and an electrical connection with the PCB 65.

As shown in FIG. 10, in this embodiment the cooling plate 63 has a plurality of internal fluid channels 79 and 80 through which a cooling fluid (e.g., water or other liquid or gas) can flow to transfer heat, extracted by the cooling plate 63 from the storage devices 62 to which it is thermally coupled, to a heat exchanging device. More specifically, and with reference to FIGS. 7 and 10, the internal fluid channels 79, 80 of the cooling plates 63 can be connected via fluid ports 81, 82, disposed below the PCB 65, to a plurality of tubes 83 (not shown in their entirety), which are also disposed below the PCB 65, to one of the two heat exchanging devices 67, 68. One of the fluid ports 81, 82 of each cooling plate 63 can function as an inlet port (e.g., port 81 shown in FIG. 7) to allow entry of the cooling fluid, e.g., from one of the heat exchanging devices or an upstream cooling plate, into the cooling plate 63. The other port can function as an outlet port (e.g., port 82 shown in FIG. 7) to allow the fluid to exit the cooling plate 63 after passage therethrough. The cooling plates 63 can be arranged in a plurality of rows such that the plates in each row are thermally coupled (via fluid flow) in series to one of the heat exchanging devices 67, 68 while the cooling plates 63 associated with different rows are coupled in parallel. Alternative coupling arrangements can be employed. For example, all of the cooling plates 63 in the enclosure 61 can be thermally coupled in series, or each cooling plate 63 can form a separate parallel thermal connection to a heat exchanging device. Flow control elements, such as valves or actuators, can be included in the tubes so that fluid flow through selected cooling plates can be stopped, regulated, or otherwise controlled, e.g., if they are not in use.

In use, in many implementations, a continuous flow of a cooling fluid through the cooling plates removes heat from the storage devices so as to maintain an average temperature of the storage devices below a threshold, e.g., 35 degrees Celsius, and/or to maintain a peak temperature of the storage devices below a threshold, e.g., 45 degrees Celsius. The fluid can flow at virtually any rate. For example, in some embodiments the flow of the fluid through the cooling plates can be in the range of about 75 Lph to 190 Lph. In some embodiments, the flow rate can vary depending on the number of cooling plates 63 through which the cooling fluid is flowing. For example, the flow rate can be in a range of about 75 Lph to 115 Lph (e.g., if a relatively large number of cooling plates have fluid flowing through them) and in a range of about 150 Lph to 190 Lph (e.g., if relatively few of the cooling plates have fluid flowing through them). The efficient removal of heat from the storage devices allows packing a sufficient number of them in the enclosure so as to achieve a high storage density, e.g., in a range of about 100 Megabytes per cubic centimeter to about 1 Gigabytes per cubic centimeter, and preferably in a range of about 0.5 Gigabytes per cubic centimeter to about 10 Gigabytes per cubic centimeter, and more preferably 20 Gigabytes per cubic centimeter.

Figure 11:
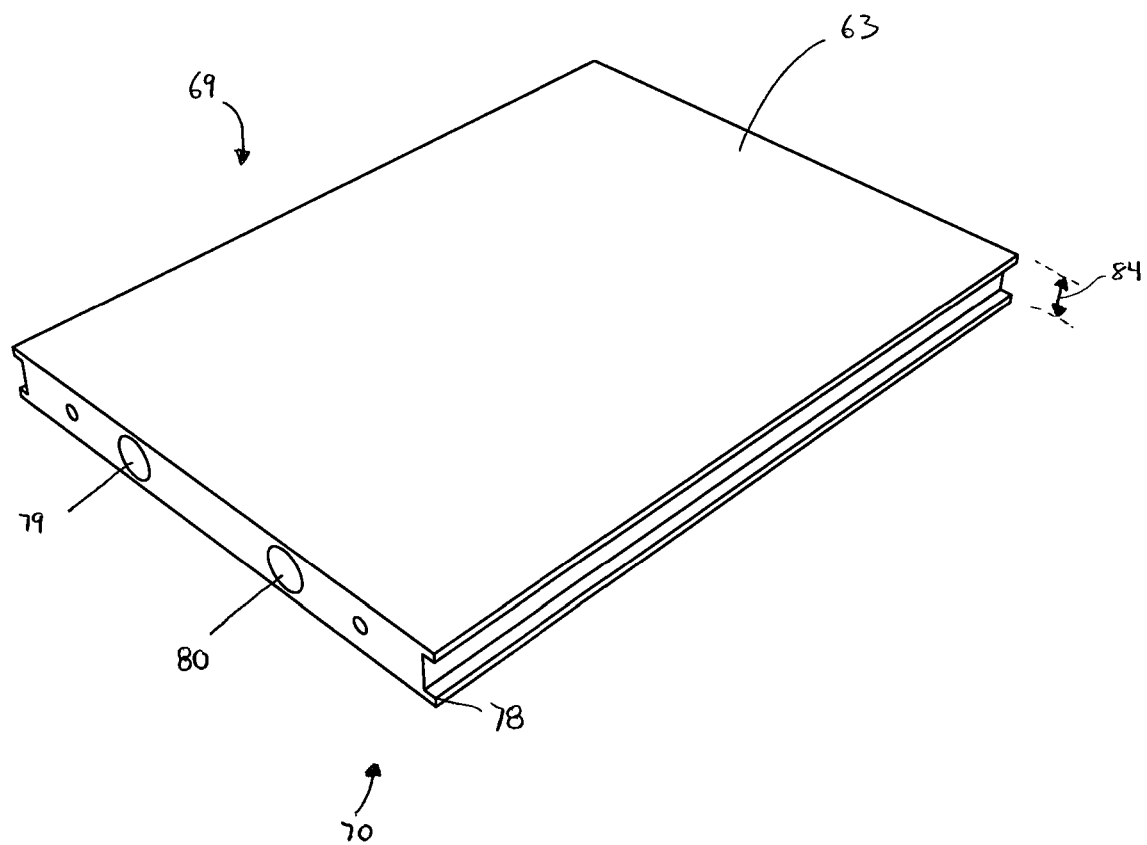
FIG. 11 illustrates an exemplary cooling plate suitable for use in the data storage system shown in FIG. 6.
Figure 12:
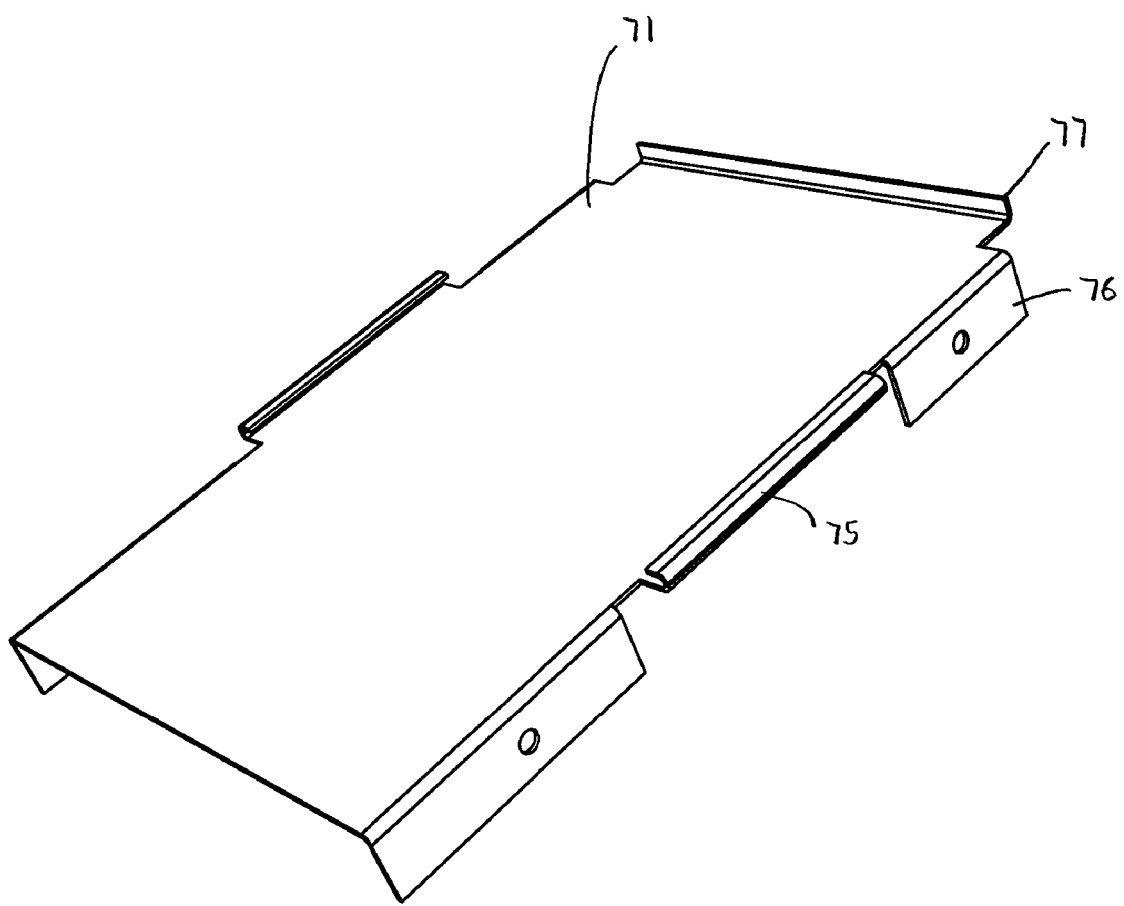
FIG. 12 illustrates an exemplary mounting plate suitable for use in the data storage system shown in FIG. 6.

FIGS. 11 and 12 depict an exemplary cooling plate 63 and mounting plate 71, respectively, in an isolation view, but with the same features previously described. The cooling plate 63 and the mounting plate 71 (as well as the enclosure 61) can be formed from a wide variety of materials, such as aluminum, copper, silver, gold, or alloys thereof, or any other material having suitable mechanical and thermal characteristics, e.g., a high thermal conductivity. Further, while both the cooling plate 63 and mounting plate 71 are illustrated as rectangular in shape, they can have virtually any shape, including shapes different than that of the storage device 62 (e.g., the cooling plate 63 need not extend to the edges of the storage device 62, or can wrap around the edges). The cooling plate 63 can have a thickness, meaning the dimension 84 shown in FIG. 11, of about 11 mm to 19 mm, or virtually any other thickness. The mounting plate 71 can have a minimal thickness, e.g., so as to transfer heat directly from the storage device to the cooling plate 63, but in some embodiments can have a thickness of about 0.8 mm to 1 mm.

Figure 13:
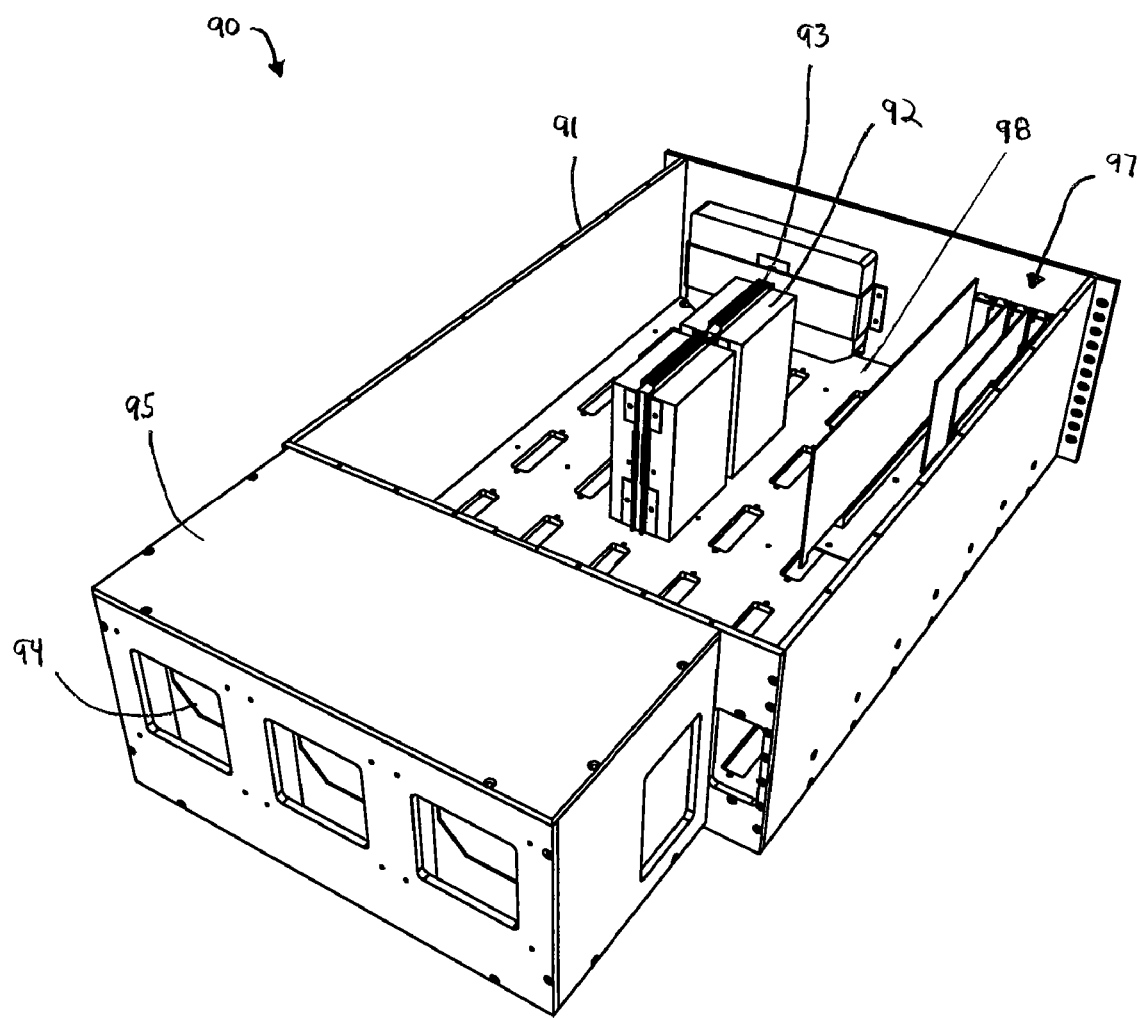
FIG. 13 illustrates an exemplary data storage system having a cooling system according to another embodiment of the invention.
Figure 14:
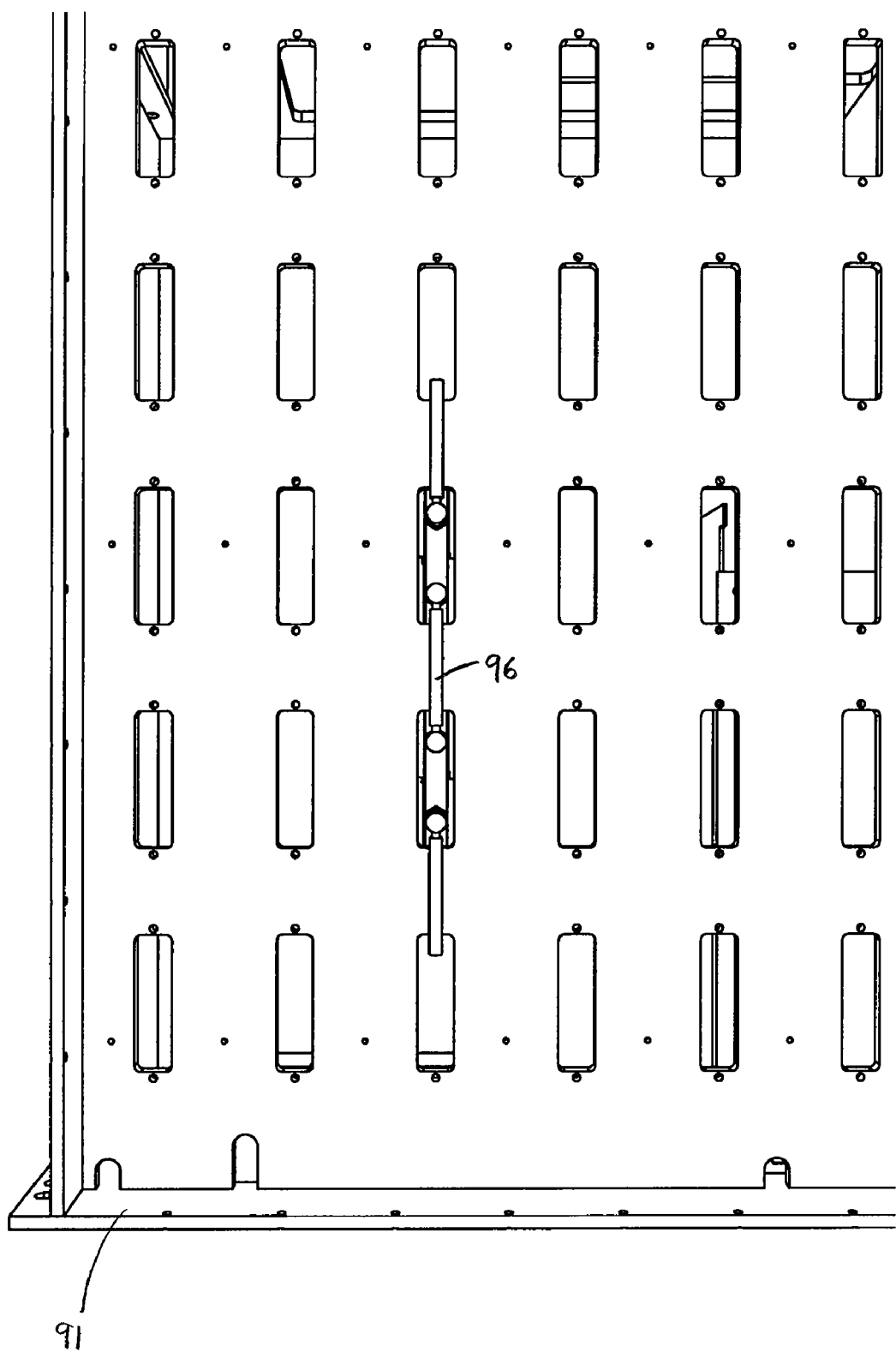
FIG. 14 illustrates a bottom view of the data storage system shown in FIG. 13.

Another exemplary embodiment of a data storage system 90 is depicted in FIG. 13. In this embodiment, the data storage system 90 includes an enclosure 91 in which a plurality of storage devices 92 are mounted, two to a cooling plate 93. A heat exchanging device 94 can be provided inside a separate but attached enclosure 95. The heat exchanging device 94 can include one or more fluid pumps for circulating a cooling fluid, one or more cooling fluid reservoirs, and/or one or more radiators, any or all of which may be disposed in the enclosure 95. As previously discussed, the heat exchanging device 94 can be thermally coupled to the cooling plates 93 via a network of tubes and/or internal channels formed within the cooling plates 93 for circulation of a cooling fluid. FIG. 14 illustrates an exemplary arrangement of tubes 96 connecting two cooling plates 93, as seen from underneath the enclosure 91.

The enclosure 91 of the data storage system 90 can also contain a controller 97, e.g., a system controller having processing circuitry, memory, and so on, for controlling and/or managing data communications and processing within the data storage system 90. Such a controller 97 can have any of the features previously described with respect to the controller 16 shown in FIGS. 1-5. Further, as shown in FIG. 14, the controller 97 can comprise one or more computer boards electrically coupled to the PCB 98 in the enclosure 91. In some embodiments, the controller 97 can be a single board computer, e.g., a Trenton Single Board Computer with an Intel Xeon processor supporting two x8 PCI Express and 2PCI-X slots. The controller 97 can include one or more input/output ports, such as a serial ATA ports, to support storage devices such as hard disks and CD-RW devices. In addition, the controller 97 can include high-speed data communication or network interfaces, e.g., one or more Gigabit Ethernet ports. In some embodiments the data storage system 90 can be configured as a RAID storage system, and the controller 97 can include one or more RAID controllers, such as an Areca serial ATA RAID controller supporting up to 24 storage devices. In other embodiments, the data storage system 90 can include 48 storage devices and can have two RAID controllers. The use of multi-channel controller chips, e.g., the Marvell 4/8 channel SATA PCI-X controller chips, can allow for simultaneous communication with the controller system and with multiple storage devices. In addition, a power control board can be included for monitoring, conditioning, and/or controlling power signals for the controller 97 and the storage devices 93. In other aspects, the data storage system 90 shown in FIG. 13 can have any or all of the features previously described in connection with FIGS. 6-12.

Those skilled in the art will appreciate that various modifications can be made to the above embodiments without departing from the scope of the invention. For example, the data storage capacity of each storage device utilized in a system of the invention can be different than those recited above.

What is claimed is:

1. A data storage system, comprising:
an enclosure;
a plurality of storage devices for storing data, the storage devices being mounted in the enclosure so as to provide a collective storage density greater than about 100 Mbytes per cubic centimeter;
a plurality of cooling plates mounted in the enclosure and having opposed cooling surfaces, at least one of the cooling surfaces being thermally coupled to at least one of the storage devices;
a heat exchanging device thermally coupled to the cooling plates for dissipating heat generated by the storage devices, and
at least one mounting element disposed in the enclosure for slidably coupling at least one of the storage devices to the at least one of the cooling plates, the mounting element having a plurality of guiding tabs configured to engage one or more rails on the at least one cooling plate.

2. The data storage system of claim 1, wherein said at least one of the storage devices is slidably coupled to said at least one of the cooling plates so as to be movable between a first position in which the storage device is thermally coupled to a first cooling surface of the cooling plate and a second position in which the storage device is removed from the enclosure.

3. The data storage system of claim 2, wherein the at least one of the storage devices comprises an I/O port configured to mate with a complementary I/O port disposed in the enclosure when the storage device is in the first position, the complementary I/O port providing a data communication interface for the at least one storage device.

4. The data storage system of claim 1, wherein the plurality of storage devices are magnetic storage devices.

5. The data storage system of claim 1, wherein the plurality of storage devices are optical storage devices.

6. The data storage system of claim 1, wherein the at least one cooling plate is coupled to the at least one storage device on one cooling surface thereof and to a second storage device on another cooling surface.

7. The data storage system of claim 1, wherein the heat exchanging device is operable to maintain an average temperature among the plurality of storage devices below a predetermined threshold value.

8. The data storage system of claim 1, wherein the predetermined threshold value is about 35 degrees Celsius.

9. The data storage system of claim 1, wherein the heat exchanging device is operable to maintain a peak temperature among the plurality of storage devices below a predetermined threshold value.

10. The data storage system of claim 1, wherein the predetermined threshold value is about 45 degrees Celsius.

11. The data storage system of claim 1, wherein at least one of the plurality of cooling plates has a thickness in the range of about 11 mm to 19 mm.

12. The data storage system of claim 1, wherein the at least one cooling plate has a cooling fluid channel formed therein, the cooling fluid channel comprising an inlet for receiving cooling fluid from the heat exchanging device and an outlet for returning cooling fluid to the heat exchanging device.

13. The data storage system of claim 12, further comprising a flow control element associated with the at least one cooling plate for controlling a flow of cooling fluid thereto.

14. The data storage system of claim 12, wherein the flow of cooling fluid within the cooling fluid channel is in the range of about 75 Lph to 190 Lph.

15. The data storage system of claim 1, wherein said collective storage density is in a range of about 100 Mbytes per cubic centimeter to about 10 Gigabytes per cubic centimeter.

16. The data storage system of claim 1, wherein said collective storage density is in a range of about 0.5 Gigabytes per cubic centimeter to about 10 Gigabytes per cubic centimeter.

17. The data storage system of claim 1, wherein said collective storage density is in a range of about 10 Gigabytes per cubic centimeter to about 20 Gigabytes per cubic centimeter.

18. A cooling system, comprising:
an enclosure;
an away of cooling plates mounted in the enclosure, each cooling plate being thermally coupled to a heat exchanging device;
a plurality of mounting elements configured to attach to a data storage device, at least one mounting element being slidably coupled to at least one cooling plate so as to be movable between an inserted position in which the at least one mounting element is disposed adjacent a cooling plate, and an extended position in which the at least one mounting element extends out of the enclosure,
wherein at least one cooling plate has opposed cooling surfaces, the at least one cooling plate being thermally coupled to a first data storage device via a mounting element coupled to one of the cooling surfaces and thermally coupled to a second data storage device via a mounting element coupled to the other cooling surface.

19. The cooling system of claim 18, wherein the at least one cooling plate is slidably coupled to a first mounting element on one of said cooling surfaces and to a second mounting element on another of said cooling surfaces.

20. The cooling system of claim 18, further comprising a plurality of data storage devices mounted in the enclosure so as to provide a data storage density greater than about 100 Mbytes per cubic centimeter, wherein at least one of said data storage devices is coupled to the at least one mounting element.

21. The cooling system of claim 18, further comprising a plurality of data storage devices mounted in the enclosure so as to provide a storage density in a range of about 100 Mbytes per cubic centimeter to about 10 Gigabytes per cubic centimeter.

22. The cooling system of claim 18, further comprising a plurality of data storage devices mounted in the enclosure so as to provide a collective storage density in a range of about 0.5 Gigabytes per cubic centimeter to about 10 Gigabytes per cubic centimeter.

23. The cooling system of claim 18, further comprising a plurality of data storage devices mounted in the enclosure so as to provide a collective storage density in a range of about 10 Gigabytes per cubic centimeter to about 20 Gigabytes per cubic centimeter.

24. The cooling system of claim 20, wherein the plurality of data storage devices comprises magnetic storage devices.

25. The cooling system of claim 20, wherein the plurality of data storage devices comprises optical storage devices.

26. The cooling system of claim 20, wherein the at least one data storage device comprises an I/O connector configured to mate with a complementary I/O connector disposed in the enclosure when the at least one mounting element is in the inserted position.

27. The cooling system of claim 20, wherein at least one mounting element is adapted to removably attach to the at least one data storage device and has a plurality of guiding tabs configured to engage one of the plurality of cooling plates for slidably coupling the at least one data storage device to the at least one cooling plate.

28. The cooling system of claim 18, wherein the heat exchanging device is operable to maintain an average temperature throughout the enclosure below a predetermined threshold value.

29. The cooling system of claim 28, wherein the predetermined threshold value is about 35 degrees Celsius.

30. The cooling system of claim 18, wherein the heat exchanging device is operable to maintain a peak temperature in the enclosure below a predetermined threshold value.

31. The cooling system of claim 30, wherein the predetermined threshold value is about 45 degrees Celsius.

32. The cooling system of claim 18, wherein at least one of the plurality of cooling plates has a thickness in a range of about 11 mm to 19 mm.

33. The cooling system of claim 18, wherein at least one cooling plate has a cooling fluid channel formed therein, the cooling fluid channel comprising an inlet for receiving cooling fluid from the heat exchanging device and an outlet for returning cooling fluid to the heat exchanging device.

34. The cooling system of claim 33, further comprising a flow control element associated with the at least one cooling plate for controlling a flow of cooling fluid thereto.

35. The cooling system of claim 33, wherein the flow of cooling fluid within the cooling fluid channel is in the range of about 75 Lph to 190 Lph.

36. A data storage system, comprising:

an enclosure;

a plurality of storage devices for storing data, the storage devices being mounted in the enclosure so as to have a collective density of greater than about 100 Mbytes per cubic centimeter;

a plurality of cooling plates mounted in the enclosure and having opposed cooling surfaces, at least one of the cooling surfaces being thermally coupled to at least one of the storage devices;

at least one mounting element disposed in the enclosure for slidably coupling at least one of the storage devices to the at least one of the cooling plates, the mounting element having a plurality of guiding tabs configured to engage one or more rails on the at least one cooling plate, a heat exchanging device thermally coupled to the cooling plates for dissipating heat generated by the storage devices;

a controller coupled to the storage devices, the controller maintaining the storage devices normally in a power-off mode and effecting transition of one or more of the storage devices from a power-off mode to a power-on mode upon receipt of a read-write request for those storage devices, the controller further effecting transition of a storage device from a power-on mode to a power-off mode if no read/write request is pending for that storage device and a selected time period has elapsed since the last read/write request for that storage device.

* * * * *